United States Patent
Cheng et al.

(10) Patent No.: US 11,688,615 B2
(45) Date of Patent: Jun. 27, 2023

(54) SYSTEM AND METHOD FOR HEATING SEMICONDUCTOR WAFERS

(71) Applicant: Taiwan Semiconductor Manufacturing Co., Ltd., Hsinchu (TW)

(72) Inventors: Wen-Hao Cheng, Hsinchu (TW); Hsuan-Chih Chu, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 168 days.

(21) Appl. No.: 16/997,686

(22) Filed: Aug. 19, 2020

(65) Prior Publication Data

US 2022/0059375 A1 Feb. 24, 2022

(51) Int. Cl.
| | |
|---|---|
| H01L 21/67 | (2006.01) |
| H01L 21/324 | (2006.01) |
| H01L 21/66 | (2006.01) |
| H01L 21/683 | (2006.01) |

(52) U.S. Cl.
CPC ...... *H01L 21/67248* (2013.01); *H01L 21/324* (2013.01); *H01L 21/67103* (2013.01); *H01L 22/26* (2013.01); *H01L 21/67011* (2013.01)

(58) Field of Classification Search
CPC ......... H01L 21/67248; H01L 21/67103; H01L 21/67011; H01L 21/324; H01L 21/6833; H01L 21/6831; H01L 22/26
See application file for complete search history.

(56) References Cited

U.S. PATENT DOCUMENTS

| | | | | |
|---|---|---|---|---|
| 5,267,607 | A * | 12/1993 | Wada | H01L 21/68728 |
| | | | | 118/724 |
| 6,507,007 | B2 * | 1/2003 | Van Bilsen | H01L 21/67248 |
| | | | | 118/724 |
| 7,274,004 | B2 * | 9/2007 | Benjamin | H01L 21/67103 |
| | | | | 118/724 |
| 10,026,631 | B2 * | 7/2018 | Oohashi | H01L 21/6831 |
| 10,096,506 | B2 | 10/2018 | Zhang et al. | |
| 10,366,867 | B2 | 7/2019 | Criminale et al. | |
| 10,381,248 | B2 * | 8/2019 | Wu | H01L 21/67248 |
| 10,629,464 | B2 * | 4/2020 | Oohashi | H01J 37/32724 |
| 2017/0215230 | A1 * | 7/2017 | Parkhe | H01L 21/67103 |
| 2018/0053666 | A1 | 2/2018 | Babayan et al. | |
| 2018/0301362 | A1 * | 10/2018 | Oohashi | H01L 21/3065 |
| 2019/0244839 | A1 * | 8/2019 | Lindberg | C23C 16/46 |
| 2019/0381628 | A1 * | 12/2019 | Habermas | G11B 5/3163 |

(Continued)

FOREIGN PATENT DOCUMENTS

| | | | | |
|---|---|---|---|---|
| CN | 101335186 | * | 4/2011 | ....... H01L 21/67103 |
| CN | 105474382 | * | 4/2016 | ....... H01L 21/67248 |

(Continued)

*Primary Examiner* — Mary A Wilczewski
(74) *Attorney, Agent, or Firm* — Seed IP Law Group

(57) ABSTRACT

A semiconductor process system includes a wafer support and a control system. The wafer support includes a plurality of heating elements and a plurality of temperature sensors. The heating elements heat a semiconductor wafer supported by the support system. The temperature sensors generate sensor signals indicative of a temperature. The control system selectively controls the heating elements responsive to the sensor signals.

20 Claims, 10 Drawing Sheets

(56) References Cited

U.S. PATENT DOCUMENTS

| | | | |
|---|---|---|---|
| 2020/0163159 A1 | 5/2020 | Parkhe | |
| 2020/0219740 A1* | 7/2020 | Oohashi | ............ H01J 37/32935 |
| 2021/0244103 A1* | 8/2021 | Courbat | .................. G01K 7/02 |
| 2022/0059375 A1* | 2/2022 | Cheng | ............... H01L 21/67103 |
| 2022/0354182 A1* | 11/2022 | Courbat | .................. A24F 40/57 |
| 2022/0386704 A1* | 12/2022 | Courbat | ................. H05B 6/105 |
| 2022/0395024 A1* | 12/2022 | Courbat | ................... H05B 6/36 |

FOREIGN PATENT DOCUMENTS

| | | | | |
|---|---|---|---|---|
| TW | 201709400 A | | 3/2017 | |
| TW | 201818473 A | | 5/2018 | |
| TW | 201818487 A | | 5/2018 | |
| TW | 202018841 A | | 5/2020 | |
| WO | WO 00/51170 | * | 8/2000 | ........... H01L 21/324 |

\* cited by examiner

SYSTEM AND METHOD FOR HEATING SEMICONDUCTOR WAFERS

BACKGROUND

Technical Field

The present disclosure relates to the field of semiconductor processing.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

To continue decreasing the size of features in integrated circuits, various thin film deposition techniques are implemented. These techniques can form very thin films. However, thin film deposition techniques also face serious difficulties in ensuring that the thin films are properly formed.

DETAILED DESCRIPTION

Figure 1:
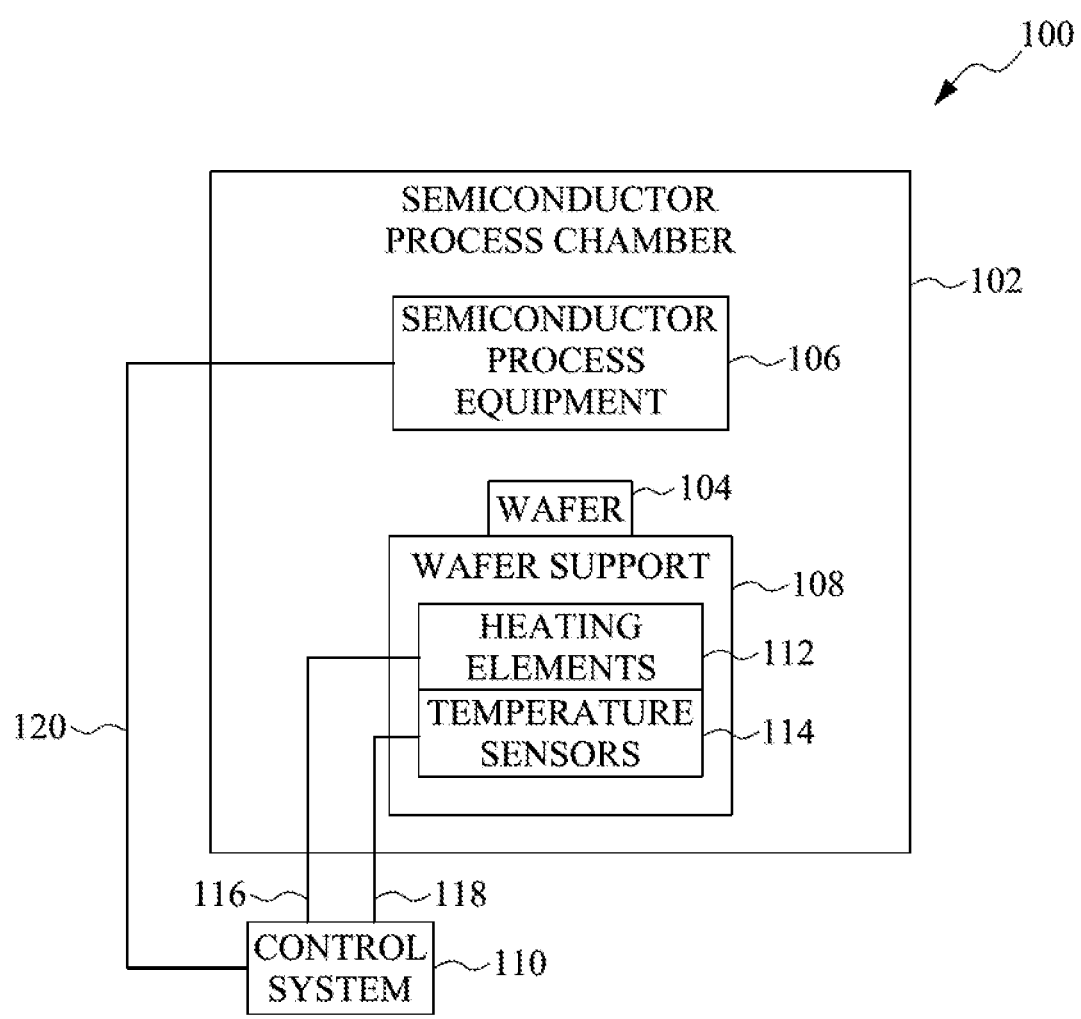
FIG. 1 is an illustration of a semiconductor process system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits over traditional semiconductor process systems. Embodiments of the present disclosure provide a wafer support with an array of selectively operable heating elements. The heating elements can be operated to provide an even temperature distribution over a surface of a wafer supported by the wafer support. An even temperature distribution can correspond to all regions of the surface having substantially the same temperature. Alternatively, the heating elements can be operated to heat selected areas of the wafer more than others. The result of this is that semiconductor process can be performed more reliably and with better outcomes. Thin films can have uniform thickness. Pad sites of the wafer can be selectively degassed in order to prevent damage to the wafer. Many other benefits can also result from selectively operable heating elements.

FIG. 1 is a block diagram of a semiconductor process system 100, according to one embodiment. The semiconductor process system 100 includes a semiconductor process chamber 102 for performing one or more semiconductor processes on a wafer 104. The semiconductor process system 100 includes semiconductor process equipment 106, a wafer support 108, and a control system 110. The components of the semiconductor process system 100 cooperate to perform semiconductor processes on the wafer 104 and to ensure that the semiconductor processes are successful.

In one embodiment, the wafer 104 is a semiconductor wafer. Typically, semiconductor wafers undergo a large number of processes during fabrication. These processes can include thin-film depositions, photoresist patterning, etching processes, dopant implantation processes, annealing processes, and other types of processes. After all of the processing steps are complete, the wafer 104 will be diced into a plurality of individual integrated circuits.

It is beneficial to heat the wafer 104 during many semiconductor processes. For example, many thin-film deposition processes benefit from elevating the temperature of the wafer during deposition of the thin-film. The elevated temperature of the wafer can promote deposition. For many thin-film deposition processes, the deposition rate is faster when the wafer 104 is at higher temperatures than at lower temperatures. In other words, during deposition, the thin-film accumulates more quickly when the wafer 104 is heated to a higher temperature. In some cases, this is because deposition materials more readily bond or react with the exposed deposition surface of the wafer 104. Additionally, materials that have been deposited on the wafer 104 may react or bond more readily with additional deposition material.

The wafer support 108 is configured to support the wafer 104. For example, the wafer support 108 may include a top surface that is flat and circular such that a circular wafer 104 may be positioned and supported thereon. As will be set forth in more detail below, the wafer support 108 may also include one or more mechanisms for securely holding the wafer 104 in place.

The wafer support 108 includes a plurality of heating elements 112. The heating elements 112 generate heat. The heat generated by the heating elements 112 can heat a top surface of the wafer support 108. The wafer 104 positioned on the wafer support 108 receives heat from the wafer support 108. Accordingly, the heating elements 112 apply heat to the wafer 104 during a semiconductor process. For example, the heating elements 112 can heat the wafer 104 during thin-film deposition process. Alternatively, the heating elements 112 can heat the wafer 104 during other semiconductor processes.

In one embodiment, the array of heating elements 112 is distributed to facilitate even heating of the wafer 104. The heating elements 112 are distributed such that when the wafer 104 is positioned on the wafer support 108, each region of a bottom surface of the wafer 104 is positioned directly above one of the heating elements 112. The distribution of a large number of heating elements 112 throughout the wafer support 108 can help ensure that all areas of the wafer 104 are evenly heated. This can help ensure that the temperature of the wafer 104 during a semiconductor process is even throughout all regions of the wafer 104. If the temperature of the wafer 104 is substantially even across the top surface of the wafer 104, then in many cases it is more likely that the semiconductor process will be completed properly.

One possible way to heat a wafer during a semiconductor process is to have a wafer support with a single large heater coil wound below a top surface of a wafer support. However, one problem with this approach is that it typically leads to uneven temperatures across the surface of the wafer. This is because a center portion of the wafer support is typically heated to a higher temperature than peripheral portions of the wafer support. This, in turn, leads to a central area of the top surface of the wafer having a higher temperature than peripheral areas of the wafer. The uneven temperature distribution across the surface of the wafer results in the failure of semiconductor processes. For example, if a central portion of the top surface of the wafer is hotter than peripheral portions of the wafer during the thin-film deposition process, then the thin-film may be thicker at the central regions than at the peripheral regions. This can result in integrated circuits with mismatched features and performance, or even integrated circuits that do not function at all.

The semiconductor process system 100 overcomes this by providing the array of heating elements 112. Because the wafer support 108 includes a large number of heating elements 112 evenly distributed below a top surface of the wafer support 108, the heating elements 112 can evenly heat the wafer 104. Accordingly, the top surface of the wafer 104 can have a substantially even temperature at central and peripheral regions. In the example of a thin film deposition process, this results in a thin-film with uniform thickness and other physical characteristics.

In one embodiment, the heating elements 112 are connected to the control system 110 by one or more electrical connections 116. The control system 110 controls the function of the heating elements 112. In particular, the control system 110 can activate or deactivate the heating elements 112. Activating the heating elements 112 corresponds to causing the heating elements 112 to generate heat. Deactivating the heating elements 112 corresponds to causing the heating elements to stop generating heat. Furthermore, the control system 110 can control how much heat is generated by the heating elements 112. Accordingly, the control system 110 can raise or lower a temperature of the wafer 104 by causing the heating elements 112 to increase or decrease heat output.

Though not illustrated in FIG. 1, in one embodiment, the control system 110 can include one or more power sources. The power sources can supply power to the heating elements 112 to enable the heating elements 112 to generate heat. Alternatively, the control system 110 is connected to a power source that is connected to the heating elements 112. This case, the control system 110 controls the heating elements 112 by controlling output of the power source to the heating elements 112.

In one embodiment, the heating elements 112 are electrical heating elements. The electrical heating elements 112 can include an electrical conductor or resistor. The heating elements 112 generate heat by passing a current through the electrical conductor or resistor. The heating elements 112 can each include a respective conductive coil. The heating elements generate heat by passing an electrical current through the conductive coils. Other types of heating elements 112 can be utilized without departing from the scope of the present disclosure.

In one embodiment, the control system 110 is configured to selectively control each heating element 112. In this case, the control system 110 can selectively activate each individual heating element 112. Thus, the control system 110 is able to activate some heating elements 112 without activating other heating elements 112. In some cases it may be beneficial to heat some regions of the wafer 104 more than other regions. The wafer support 108 and the control system 110 enable selective heating of different regions of the wafer 104.

In one embodiment, the control system 110 is configured to selectively control how much heat is generated by each heating element 112. The control system 110 selectively causes some heating elements 112 to generate more heat than other heating elements 112. In one example, peripheral regions of the wafer 104 may tend to dissipate more heat than central regions of the wafer 104. Accordingly, to ensure an even temperature of the wafer 104, the control system 110 may control peripheral heating elements 112 to generate more heat than central heating elements 112 to account for the greater amount of heat dissipation at the peripheral regions of the wafer 104. The electrical connectors 116 can include a large number of electrical connectors that enable selective heating of individual heating elements 112.

In one embodiment, the temperature sensors 114 are configured to sense the temperature of the heating elements 112. The temperature sensors 114 can be positioned in thermal contact with the heating elements 112. The thermal contact enables the temperature sensors 114 to sense the temperature of the heating elements 112. Alternatively, the temperature sensors 114 may be positioned adjacent to, but not in thermal contact with, the heating elements 112.

In one embodiment, the temperature sensors 114 are electrically connected to the control system 110 by plurality of electrical connectors 118. The temperature sensors 114 can generate sensor signals indicative of the temperature of the heating elements 112, the wafer support 108, and/or the wafer 104. The temperature sensors 114 can pass the sensor signals to the control system 110. Each temperature sensor 114 can provide individual sensor signals to the control system 110. The sensor signals from an individual temperature sensor 114 indicate the temperature at or adjacent to the location of that temperature sensor 114.

In one embodiment, the control system 110 can control the heating elements 112 responsive to the sensor signals from the temperature sensors 114. The control system 110 can selectively activate or deactivate individual heating elements 112 responsive to the sensor signals from the temperature sensors 114. The control system 110 can adjust the heat output by individual heating elements 112 responsive to the sensor signals from the temperature sensors 114.

In one embodiment, the wafer support 108 includes a respective temperature sensor 114 for each heating element 112. Accordingly, for each heating element 112, a respective temperature sensor 114 generates sensor signals indicating the temperature of that heating element 112, or the temperature in a region adjacent to that heating element 112. In this case, the control system 110 receives sensor signals for each individual heating element 112. The control system 110 can then adjust the heat output of the individual heating elements 112 responsive to the respective sensor signals in order to generate or maintain a selected heat profile of the wafer 104.

In one embodiment, the respective temperature sensor 114 for each heating element 112 senses the temperature of the wafer 104 at a region above the heating element 112. Accordingly, for each heating element 112, a respective temperature sensor 114 generates sensor signals indicating the temperature of the wafer 104 at a region above the heating element 112. The control system 110 receives sensor signals for each individual heating element 112. The control system 110 can then adjust the heat output of the individual heating elements 112 responsive to the respective sensor signals in order to generate or maintain a selected heat profile of the wafer 104.

In one embodiment, the wafer support 112 includes, for each heating element 112, two respective temperature sensors 114. A first of the respective temperature sensors 114 senses a temperature of the heating element 112. A second of the two respective temperature sensors senses a temperature of the wafer 104 at a region above the heating element 112. In this case, the control system 110

The semiconductor process system 100 includes semiconductor process equipment 106. The semiconductor process equipment 106 assists in performing the semiconductor processes. The semiconductor process equipment 106 can include equipment that assists in thin-film deposition processes, etching processes, ion implantation processes, annealing processes, photolithography processes, and other types of processes. The semiconductor process equipment 106 can include components for generating a plasma within the semiconductor process chamber 102. Some of the semiconductor process equipment 106 may be positioned entirely within the semiconductor process chamber 102. Some of the semiconductor process equipment 106 may be positioned partially within the semiconductor process chamber 102 and partially external to the semiconductor process chamber 102. Some of the semiconductor process equipment 106 may be positioned entirely external to the semiconductor process chamber 102.

The semiconductor process equipment 106 can include equipment for managing gas or flow within the semiconductor process chamber 102. The process equipment can include components for introducing gasses or fluids into the semiconductor process chamber 102, for removing gasses or fluids from the semiconductor process chamber, and for monitoring and controlling the flow, presence, or composition of gasses within the semiconductor process chamber 102. The semiconductor process equipment 106 can include equipment for retaining a selected pressure within the interior of the semiconductor process chamber 102.

The semiconductor process equipment 106 can include electrical components for generating electric fields, voltages, magnetic fields, electrical signals, or other types of electrical effects. Accordingly, the semiconductor process equipment 106 can include electrodes, wires, radiofrequency power sources, transmitters, receivers, or other types of electrical equipment that may be utilized in semiconductor processes.

In one embodiment, the control system 110 is communicatively coupled to the semiconductor process equipment 106 by one or more electrical connectors 120. The control system 110 can control the semiconductor process by controlling the semiconductor process equipment 106. The control system 110 can adjust operation of the semiconductor process equipment 106 responsive to sensor signals from the temperature sensors 114. For example, in some cases it may be beneficial to adjust a flow of deposition materials or other fluids into the deposition chamber based on the temperature of the wafer 104. In other cases it may be beneficial to adjust the parameters of plasma generation within the semiconductor process chamber 102 based on the temperature in the wafer 104. The control system 110 can make these adjustments responsive to the sensor signals from the temperature sensors 114.

In one embodiment, the control system 110 may cause the semiconductor process equipment 106 to entirely stop a semiconductor process in response to the sensor signals provided by the temperature sensors 114. In order to avoid serious damage to the semiconductor wafer 104, in some cases the control system 110 may determine that the best course of action is to stop the semiconductor process entirely until other adjustments or repairs can be made.

In one embodiment, the control system 110 can include portions external to the semiconductor process chamber 102, portions within the semiconductor process chamber 102, and/or portions executed within the cloud. Accordingly, the control system 110 may be distributed with various processing, memory, and data transmission resources in multiple locations. The control system 110 may also include virtual memory, processing, and data transmission resources in the cloud.

In one embodiment, the control system 110 can include a machine learning-based analysis model. The machine learning-based analysis model can be trained to selectively operate individual heating elements 112 responsive to sensor signals from the temperature sensors 114. The machine learning-based analysis model can be trained to control or adjust semiconductor process parameters based on the sensor signals.

Figure 2A:
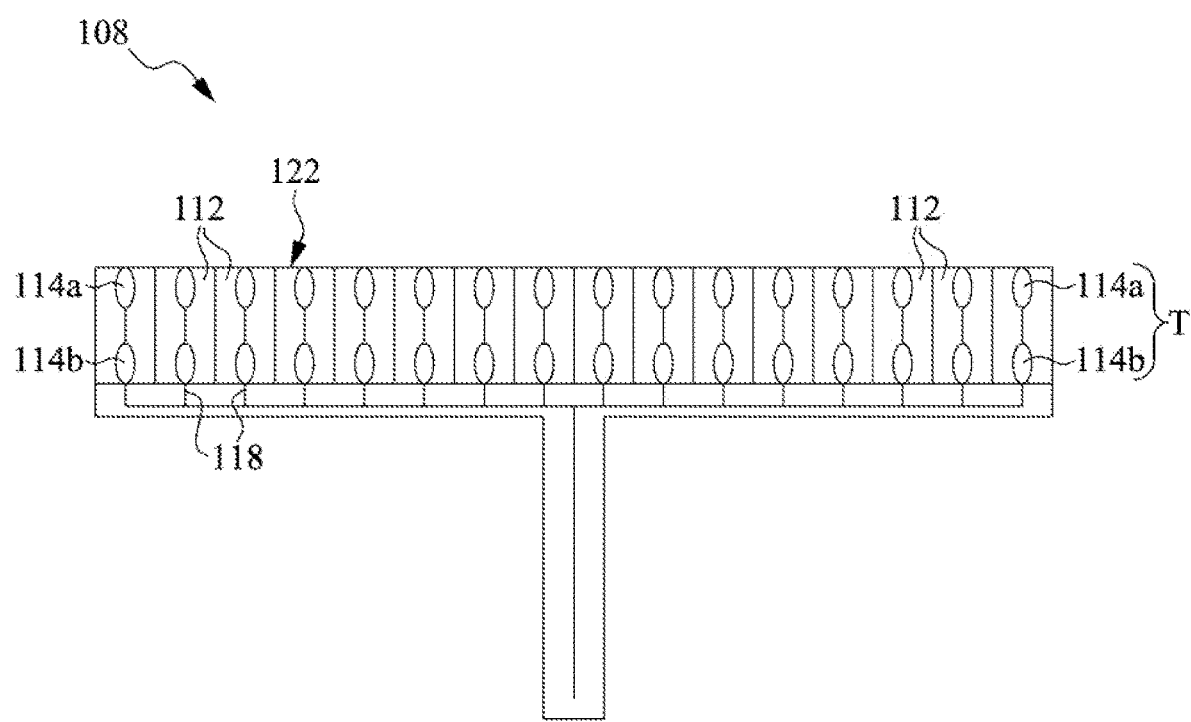
FIG. 2A is a cross-sectional view of a wafer support, according to one embodiment.

FIG. 2A is a cross-sectional view of the wafer support 108, according to one embodiment. The wafer support 108 includes a top surface 122. During semiconductor processing, a wafer 104 (not shown in FIG. 2A) is positioned on the top surface 122 of the wafer support 108. The wafer support 108 includes an array of heating elements 112. Each heating element 112 generates heat. The heating elements 112 can generate heat substantially as described in relation to FIG. 1. The heating elements 112 can be connected to a control system 110 by electrical connectors 116 (not shown in FIG. 2A), as described in relation to FIG. 1.

During semiconductor processing, the heating elements 112 generate heat. The heat generated by the heating elements 112 heats the wafer 104 via the top surface 122 of the wafer support 108. The heating elements 112 can be operated to establish or maintain a uniform temperature across a deposition surface of the wafer 104. The heating elements 112 can be operated to establish a selected temperature distribution across the surface of the wafer 104.

In one embodiment, each heating element 112 includes a top temperature sensor 114a and the bottom temperature sensor one 114b. The top temperature sensor 114a in each heating element 112 senses the temperature of the wafer 104. The bottom temperature sensor 114b in each heating element 112 senses the temperature of the heating element 112.

In one embodiment, the top temperature sensor 114a is positioned at the top surface 122 of the wafer support 108. In this case, the top temperature sensor 114a senses a temperature of a bottom surface of the wafer 104. The bottom surface of the wafer 104 is in contact with the top surface 122 of the wafer support 108 when the wafer 104 is placed on the wafer support 108. The portion of the top temperature sensor 114a can be in direct contact with a bottom surface of the wafer 104.

In one embodiment, the top temperature sensor 114a generates sensor signals indicative of the temperature of the bottom surface of the wafer 104 directly above the top temperature sensor 114a. The temperature of the top surface of the wafer can be extrapolated from the temperature of the bottom surface of the wafer. In practice, there will be a temperature gradient between the bottom surface of the wafer 104 and the top surface of the wafer 104. Because the bottom surface of the wafer 104 is closer to the heating element 112, the bottom surface may have a slightly higher temperature than the top surface of the wafer. The control system 110 can estimate a temperature of the top surface of the wafer 104 based on the temperature of the bottom surface of the wafer 104.

In one embodiment, the top temperature sensor 114a of each heating element 112 is positioned slightly below a top surface 112 of the wafer support 108. In this case, the wafer support 108 may include a layer of material on top of the heating elements 112. This layer of material can include a thermally conductive material to distribute heat from the heating elements 112 to the wafer 104.

In one embodiment, the heating elements 112 have a thickness T. In one example, the thickness T is between 3 cm and 8 cm. The heating elements 112 can have other thicknesses T without departing from the scope of the present disclosure.

Figure 2B:
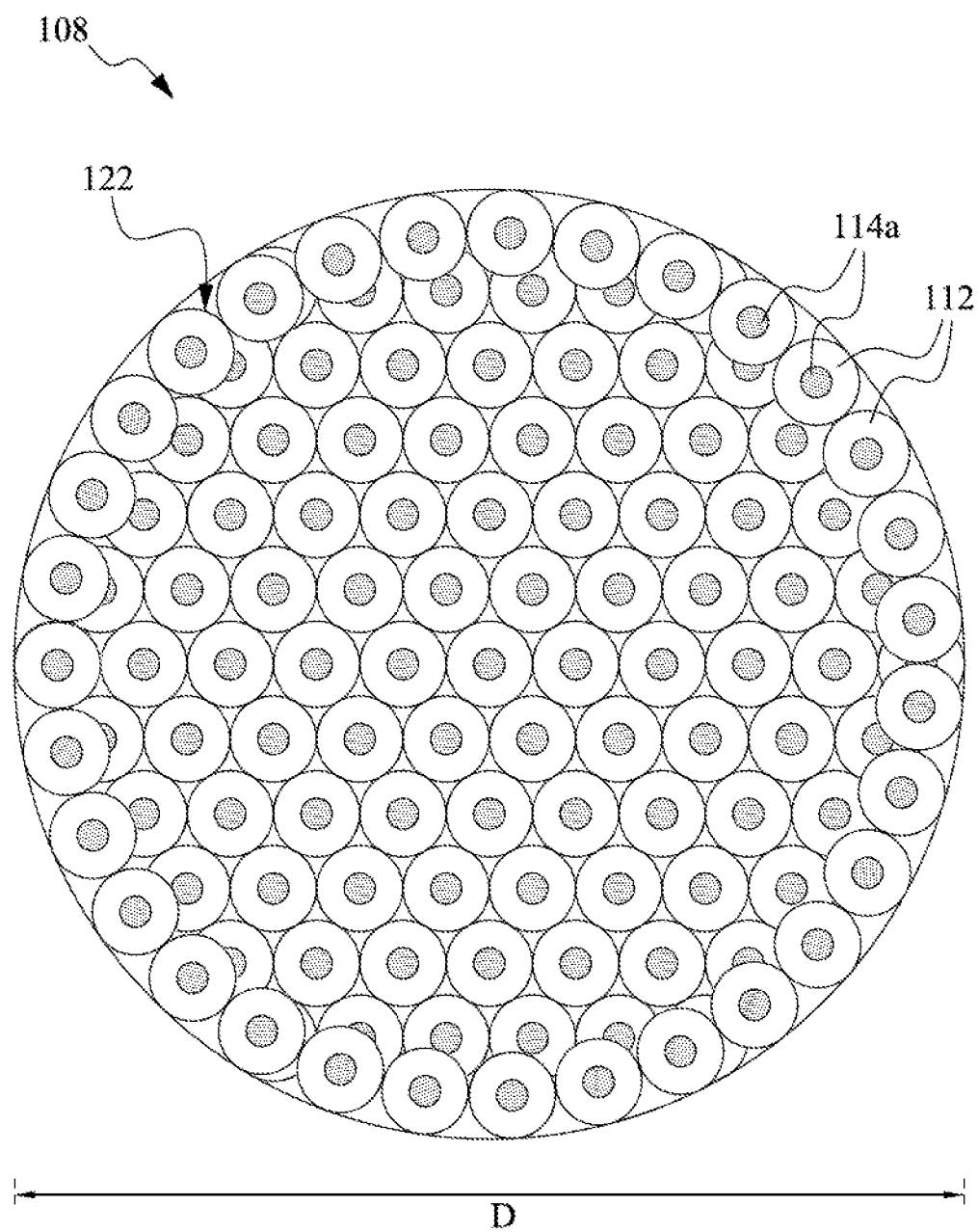
FIG. 2B is a top view of a wafer support, according to one embodiment.

FIG. 2B is a top view of the wafer support 108 of FIG. 2A, according to one embodiment. The view of FIG. 2B shows top temperature sensors 114a expose at the top surface 122. However, in some embodiments, the top temperature sensors 114a are not exposed at the top surface 122. Instead, the top temperature sensors 114a may be positioned slightly below a top surface 122 of the wafer support 108. In this case, the top temperature sensors 114a would not be visible at the top surface 122 of the wafer support 108.

In one embodiment, the top surface 122 of the wafer support 108 is circular. The top surface 122 of the wafer support 108 as a diameter D. The diameter D is selected to support a circular wafer 104 of selected size. In one embodiment, the diameter D is selected to be the same diameter as a wafer 104 that will be supported by the wafer support 108. In one example, the wafer support 108 is configured to support wafers of diameter 300 mm. In this case, the wafer support 108 has a diameter of 300 mm. Alternatively, the diameter D may be slightly larger than a diameter of the largest wafers 104 expected to be supported on the wafer support 108.

FIG. 2B illustrates a distribution of heating elements 112 having circular top surfaces. Taken together with the view of FIG. 2A, the heating elements 112 have a cylindrical shape. However, in alternative embodiments, the heating elements 112 can have top surfaces other than circular and overall shapes other than cylindrical without departing from the scope of the present disclosure. Furthermore, the wafer support 108 includes a material positioned between the heating elements 112 such that the wafer support 108 is substantially solid and without air gaps. However, in other embodiments, the wafer support 108 may include gaps or voids.

Figure 2C:
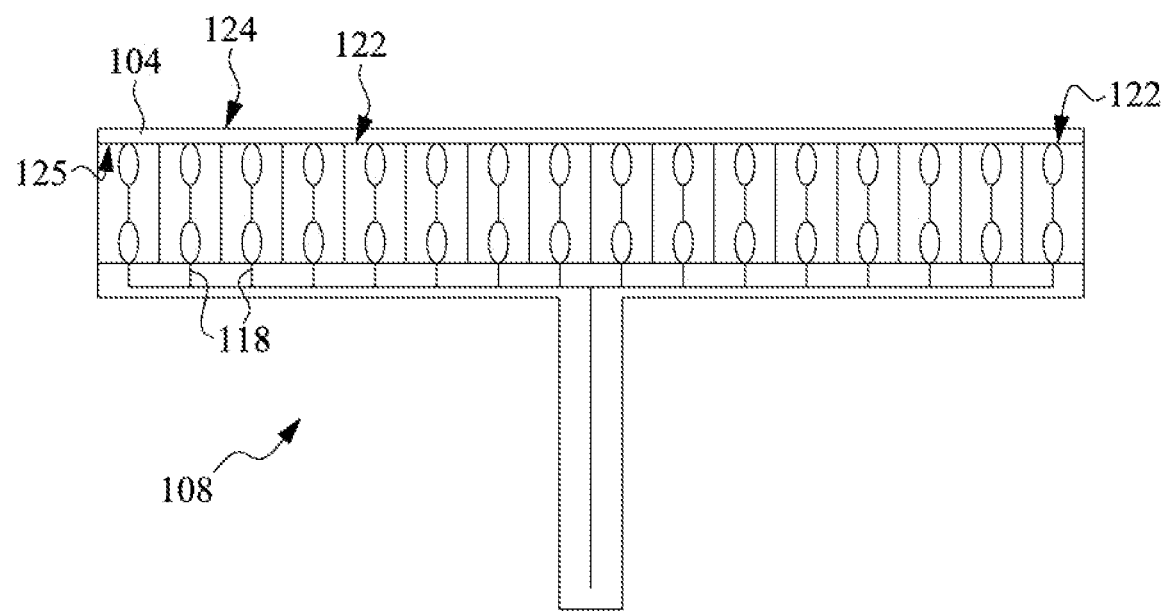
FIG. 2C is a cross-sectional view of a wafer support, according to one embodiment.

FIG. 2C is a cross-sectional view of a wafer support 108 with a wafer 104 positioned on the wafer support one, according to one embodiment. The wafer 104 includes a top surface 124 and the bottom surface 125. The bottom surface of the wafer 104 is in direct contact with a top surface 122 of the wafer support 108. The top surface 124 of the wafer 104 can also be termed a deposition surface. This is because a thin-film deposition process will deposit a thin-film on the top surface 124 of the wafer 104. While the top surface 124 is shown in a substantially flat in FIG. 2C, and practice the top surface 124 may include surface features such as protrusions and indentations in accordance with the patterning of thin films of the wafer 104.

Figure 3A:
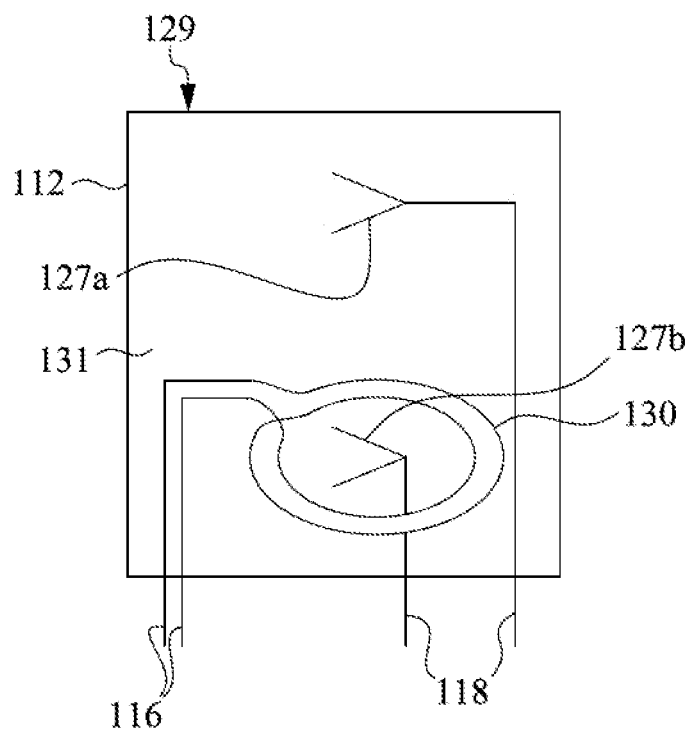
FIG. 3A is a cross-sectional view of a heating element, according to one embodiment.

FIG. 3A is a cross-sectional view of a heating element 112, according to one embodiment. The heating element 112 of FIG. 3A is one example of a type of heating element that can be utilized in the wafer support 108 of FIGS. 1-2C. The heating element 112 generates heat in order to heat a wafer 104 during a semiconductor process.

In one embodiment, the heating element 112 includes a heating coil 130. The heating element 112 generates heat when electrical current is passed through the heating coil 130. The heating coil 130 can include a conductive material such as copper, tungsten, or other conductive materials that generate the when an electrical current is passed through the heating coil 130. The heating coil 130 can also include a resistor. The heating coil 130 may be clad in insulating material. Those of skill in the art will recognize, in light of the present disclosure, that many configurations and materials can be utilized for heating coil 130 without departing from the scope of the present disclosure.

In one embodiment, the heating coil 130 is connected to two electrical connectors 116. The two electrical connectors 116 can be coupled to the control system 110 (see FIG. 1) or to a power source controlled by the control system 110. The control system 110 can selectively pass a current to the heating coil 130 via the two electrical connectors 116. In particular, a voltage can be applied between the electrical connectors 116 in order to pass a current to the heating coil 130.

In one embodiment, each heating coil 130 can be selectively controlled by the control system 110, as described previously in relation to FIG. 1. Accordingly, each heating element 112 can include two or more electrical connectors 116 coupled to the control system 110. The control system 110 can then selectively activate, deactivate, or adjust an electrical current through the heating coil 130 via the electrical connectors 116.

In one embodiment, the heating element 112 includes a top thermocouple 127a and a bottom thermocouple 127b. The top and bottom thermocouples 127a, 127b, are examples of heating elements 114 of FIG. 1 or top and bottom heating elements 114a, 114b of FIGS. 1-2C. Accordingly, the top and bottom thermocouples 127a, 127b are temperature sensors.

In one embodiment, the top thermocouple 127a is configured to generate sensor signals indicative of a temperature of the wafer 104 in a region directly above the heating element 112. The top thermocouple 127a can function in a standard thermocouple manner by generating a voltage between two leads. The voltage is indicative of the temperature in the vicinity of the two leads in accordance with well-known relationships. The two leads of the top thermocouple 127a can be positioned at a top surface 129 of the heating element 112. The top surface 129 of the heating element 112 may or may not correspond to the top surface 122 of the wafer support 108, in accordance with the particular structure of the wafer support 108 in various embodiments. Alternatively, the two leads of the top thermocouple 127a can be positioned slightly below a top surface 129 of the heating element 112.

In one embodiment, the bottom thermocouple 127b is positioned to sense a temperature in the vicinity of the heating coil 130. The bottom thermocouple 127b functions in a same manner as the top thermocouple 127a. The bottom thermocouple 127b generates a voltage between two leads. The voltage is indicative of the temperature in the vicinity of the two leads. The two leads of the bottom thermocouple 127b may be positioned within, but not in contact with, the heating coil 130. The bottom thermocouple 127b generates sensor signals indicative of the temperature of the heating coil 130.

In one embodiment, the top and bottom thermocouples 127b are connected to the control system 110 by electrical connectors 118. Although only a single electrical connector 118 is shown connecting each of the top and bottom thermocouples 127a, 127b, in practice, there may be two electrical connectors 118 for each of the top and bottom thermocouples 127a, 127b. The control system 110 can adjust the function of the heating coil 130 responsive to the sensor signals from the top and bottom thermocouples 127a, 127b.

In one embodiment, the heating element 112 includes a ceramic material 131 covering the heating coil 130, the top thermocouple 127a, and the bottom thermocouple 127b. The ceramic material 131 is selected to conduct heat from the heater coil 130 to the wafer 104. The ceramic material 131 may make up a majority of the volume of the heating element 112. The ceramic material 131 may be positioned to prevent electrical short circuits between different areas of the heater coil 130. The ceramic material 131 may also be positioned to prevent electrical short circuits between the thermocouples 127a, 127b and the heater coil 131.

Figure 3B:
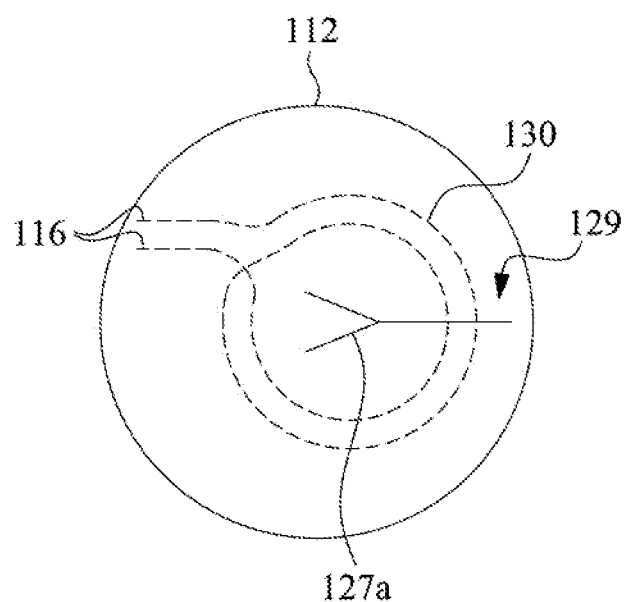
FIG. 3B is a top view of a heating element, according to one embodiment.

FIG. 3B is a top view of the heating element 112 of FIG. 3A, according to one embodiment. In the example of FIG. 3B, the heating element 112 has a substantially circular top surface 129. Accordingly, the heating element 112 of FIGS. 3A, 3B may have a substantially cylindrical shape. However, other shapes can be utilized for the heating element 112 of FIGS. 3A, 3B without departing from the scope of the present disclosure.

In the view of FIG. 3B, the top thermocouple 127a is visible at a top surface 129 of the heating element 112. However, in practice, the top thermocouple 127a may not be visible as it may be positioned below the top surface 129. In the view of FIG. 3B, the heating coil 130 and the electrical connectors 116 are illustrated in dashed lines indicating that they are positioned below the top surface 129 of the heating element 112. The bottom thermocouple 127b is not visible as it is positioned directly below the top thermocouple 127a in the example of FIGS. 3A, 3B. Other shapes and configurations of a heating element 112 can be utilized without departing from the scope of the present disclosure.

Figure 4A:
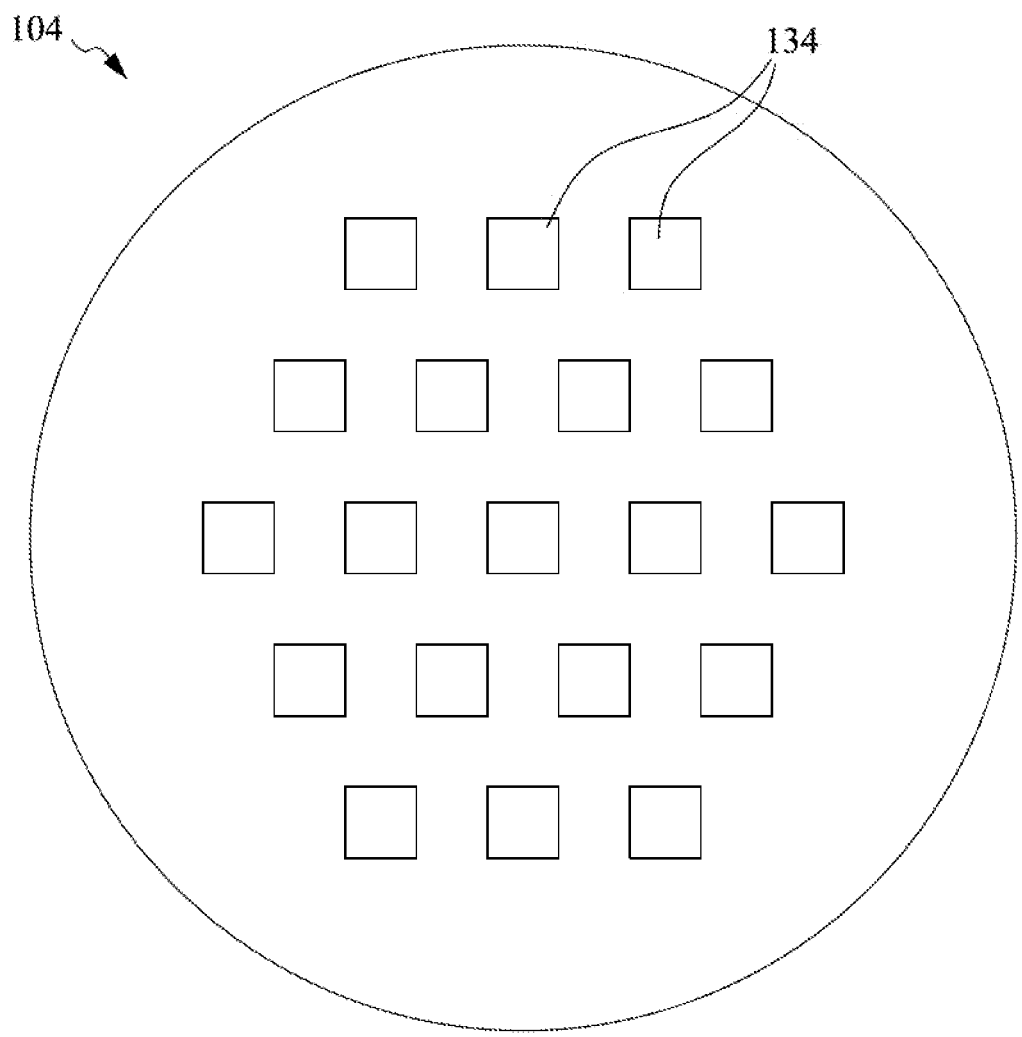
FIG. 4A is a top view of a wafer, according to one embodiment.

FIG. 4A is a top view of a wafer 104, according to one embodiment. The wafer 104 has a plurality of pad sites 134. The pad sites 134 can correspond to connection pads of integrated circuits that will be diced from the wafer 104. When the integrated circuits are packaged, wire bonds may be coupled between the pads and leads on a lead frame. During the wire bonding process, the pad sites may be heated due to a soldering or other bonding process. If there is moisture in any of the layers of the wafer 104 at the pad site 134, then it is possible that the moisture will become vaporized. The vapor may burst out from the layer and damage the pad site or the wire bond.

Figure 4B:
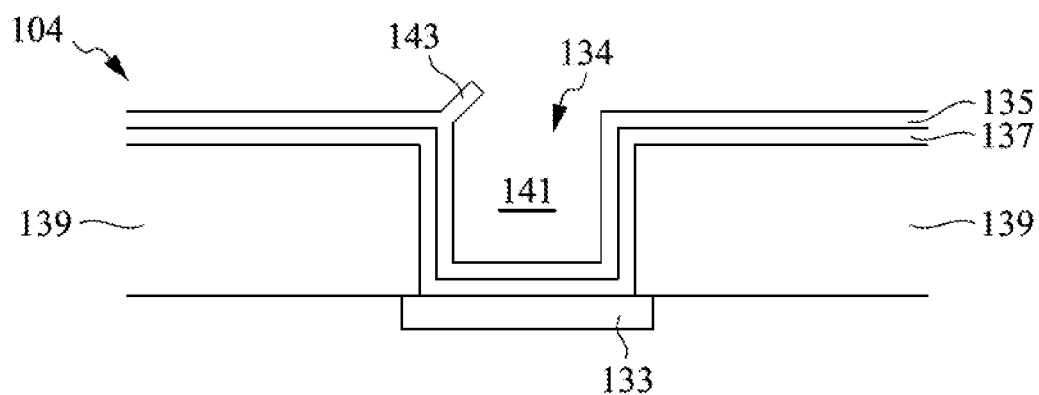
FIG. 4B is a cross-sectional view of a wafer, according to one embodiment.
Figure 4C:
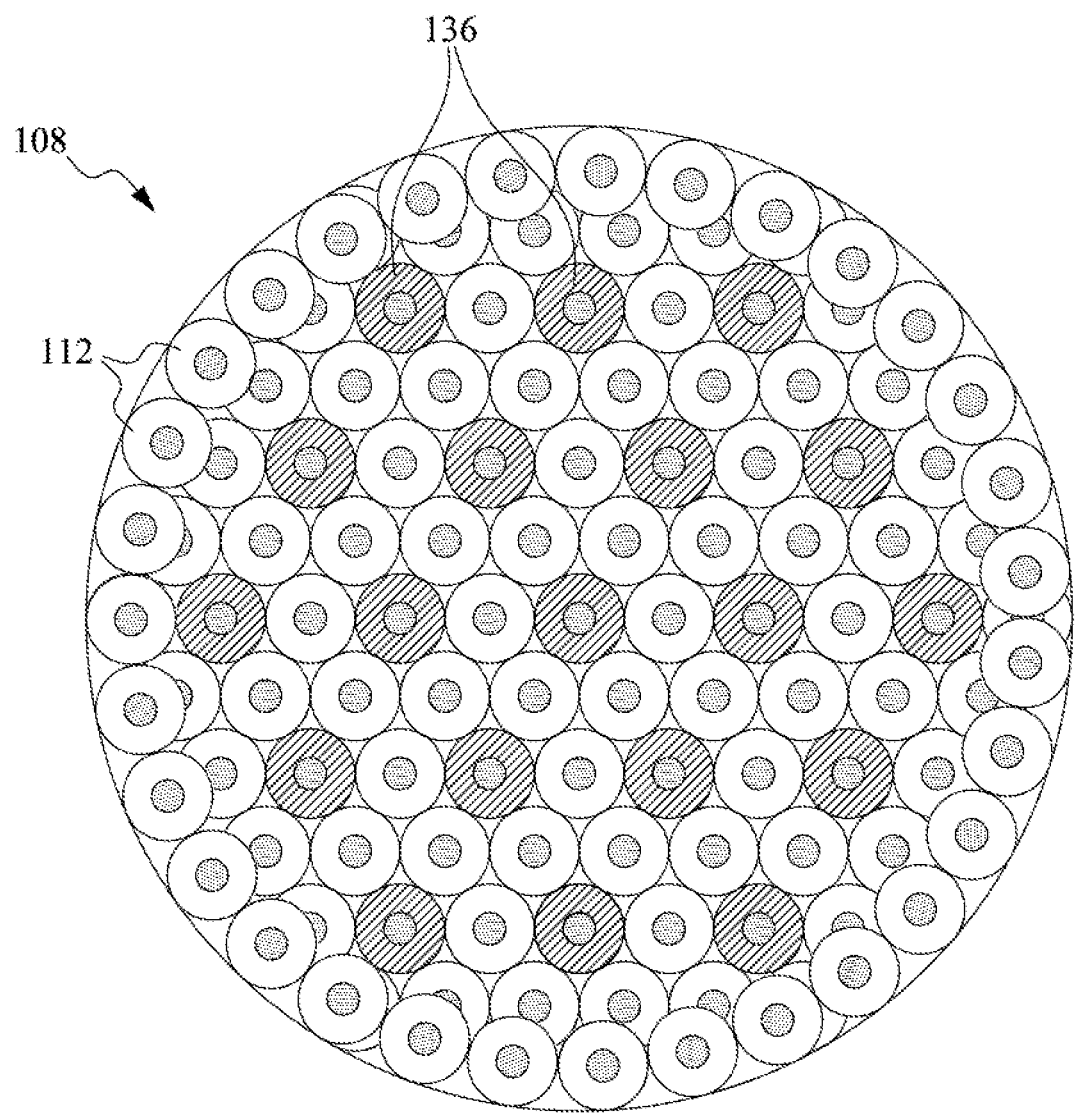
FIG. 4C is a top view of a wafer support, according to one embodiment.

FIG. 4B is a cross-sectional view of a pad site 134 of the wafer 104, according to one embodiment. The pad site 134 includes a copper pad 133 and passivation layer 139. A barrier layer 137 of tantalum or tantalum nitride is positioned on the copper pad 133 and on a passivation layer 139. A layer 135 aluminum is positioned on the barrier layer 137. The passivation layer 139 has been etched above the copper pad 133, thereby forming a trench or hole 141. As described above, if there is moisture during a wire bonding process at the pad site 134, the moisture may turn into vapor and burst out in a process called outgassing. The bursting out of the vapor can generate extrusions 143 in the layer 135. The extrusions 143 are undesirable and may cause the wire bonding process to fail. The materials and structures shown in relation to FIG. 4B are given by way of nonlimiting example. Other materials can be utilized for the pad site 134 without departing from the scope of the present disclosure FIG. 4C is a top view of a wafer support 108, according to one embodiment. The wafer support 108 is able to reduce or prevent the outgassing problem and avoid generation of the extrusions 143 as described in relations to FIGS. 4A, 4B. In particular, during formation of the pad sites 134, a group 136 of heating elements 112 can be selectively operated at a higher temperature than the other heating elements 112. The group 136 of heating elements 112 corresponds to heating elements 112 positioned directly below the pad sites 134 shown in FIG. 4A. In particular, the control circuit 110 can selectively control the group 136 of heating elements 112 at selected positions to be heated to a relatively high temperature. The elevated temperature causes any moisture present to vaporize during the deposition processes so that no moisture remains after the deposition processes. This effectively degases the pad sites 134. When wire bonding is performed at a later stage after dicing, the pad sites 134 have already been degassed. The result is that gases do not burst out damage the pad sites, for example by forming extrusions 143.

Figure 5A:
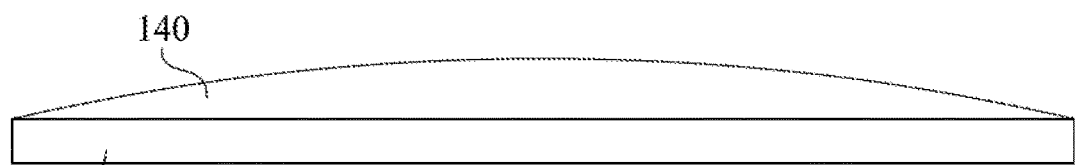
FIG. 5A is a cross-sectional view of a wafer after a first thin film deposition process, according to one embodiment.

FIG. 5A is a cross-sectional view of a wafer 104 after a first thin film deposition process, according to one embodiment. A first thin film 140 has been deposited on the wafer 104. Due to an error in the deposition process of the thin-film 140, or by design, the thin-film 140 does not have uniform thickness. In particular, the thin-film is thicker near central area and thinner near peripheral areas of the wafer 104.

Figure 5B:
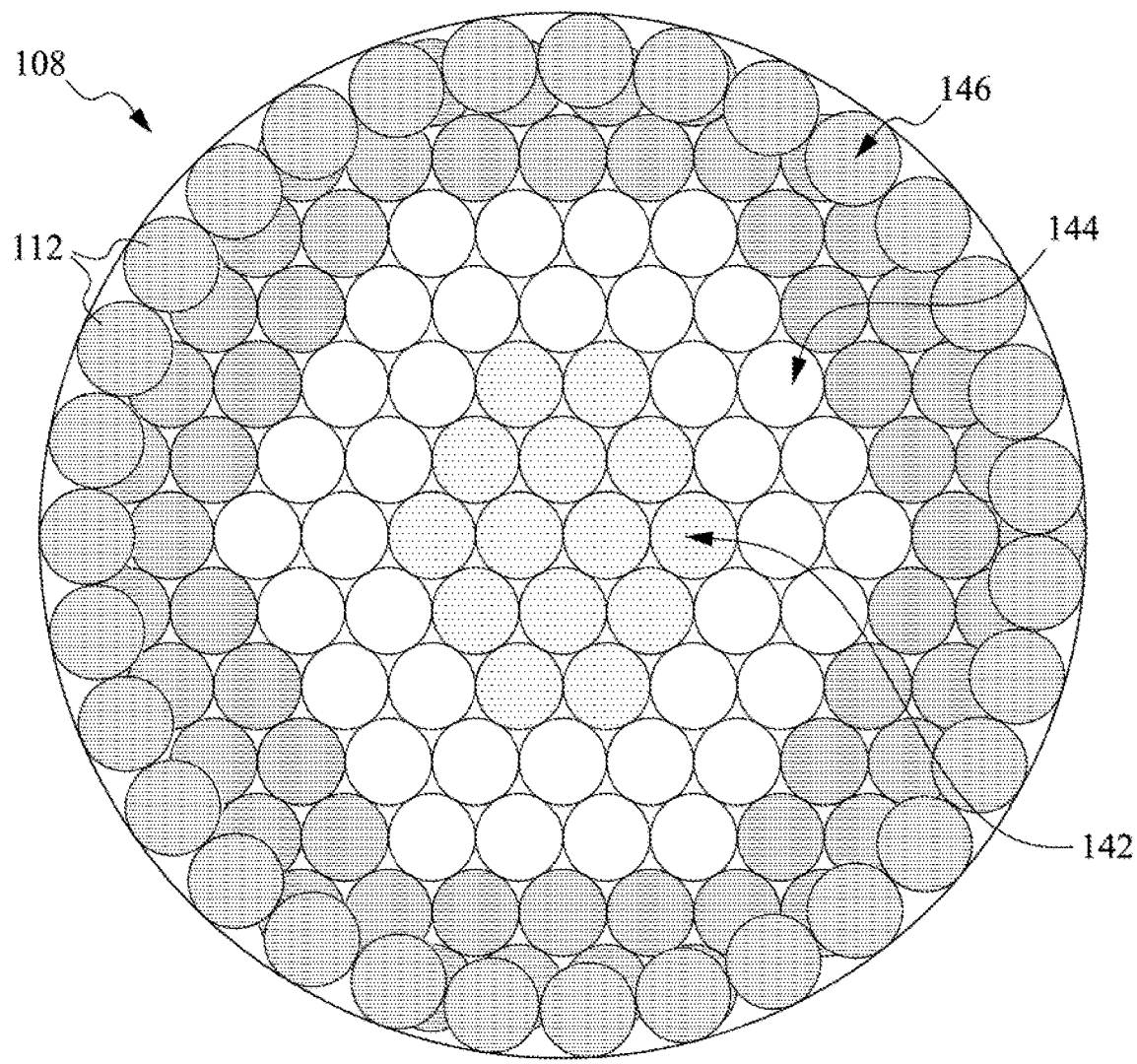
FIG. 5B is a cross-sectional view of a wafer support illustrating selective activation of heating elements during a second deposition process, according to one embodiment.

FIG. 5B is a top view of the wafer support 108 including a plurality of selectively operable heating elements 112, according to one embodiment. The control system 110 (see FIG. 1) receives data indicating an uneven thickness of the thin-film 140. The control system 110 then selectively controls various groups of heating elements 112 during a deposition process of a second thin-film. In particular, during deposition of the second thin-film, the control system 110 selectively controls a first group 142 of heating elements 112, a second group 144 of heating elements 112, and a third group 144 of heating elements 112.

In one embodiment, the control system 112 controls the first group 142 of heating elements 112 to heat to a first temperature. The control system 112 controls the second group 144 of heating elements 112 to a second temperature greater than the first temperature. The control system 112 controls the third group 146 of heating elements 112 to a third temperature greater than the second temperature. In other words, the control system 110 controls the heating elements, during the deposition process of the second thin-film, 112 to generate less heat the those regions where the first thin-film 140 is thickest and to generate more heat in those regions or the first thin-film 142 is thinnest. The second thin-film deposits more rapidly at those areas where the wafer 104 is hottest. The result is that the second thin-film has a top surface that is substantially flat in spite of the uneven surface of the first thin-film.

Figure 5C:
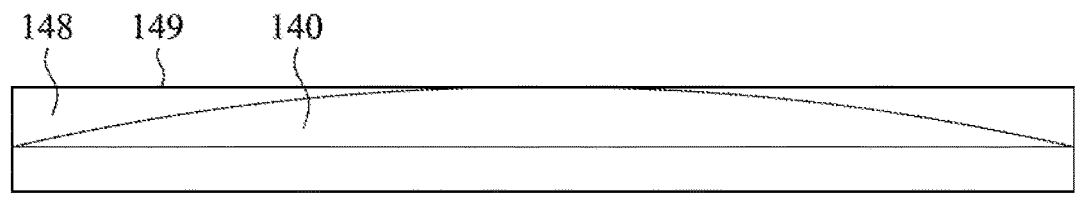
FIG. 5C is a cross-sectional view of a wafer after the second thin film deposition process, according to one embodiment.

FIG. 5C is a cross-sectional view of the wafer 104 of FIG. 5A after deposition of a second thin-film 148 on the first thin-film 140. The second thin-film 148 has a substantially flat top surface 149 in spite of the uneven thickness of the first thin-film 140. This can be accomplished without a separate planarization process by selectively controlling the heat output of groups heating elements 112 or individual heating elements 112 during the second deposition process.

Figure 6A:
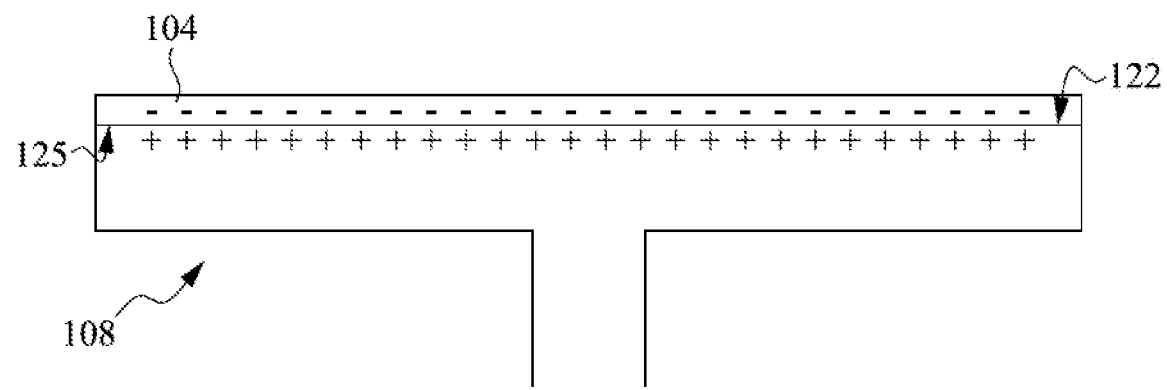
FIG. 6A is a cross-sectional view of a wafer support, according to one embodiment.

FIG. 6A illustrates a wafer support 108 supporting a wafer 104, according to one embodiment. Though not illustrated in FIG. 6A, the wafer support 108 can include a plurality of heating elements 112 as shown and described in relation to FIGS. 1-5C. The wafer support 108 is configured to hold the wafer 104 by electrostatic attraction. In particular, a voltage is applied between a top surface 122 of the wafer support 108 and the bottom surface 125 of the wafer 104. In the example of FIG. 6A, positive charges accumulate at the top surface 122 of the wafer support 108. Negative charges accumulate at the bottom surface 125 of the wafer 104. The result is that the bottom surface 125 of the wafer 104 is attracted to the top surface 122 of the wafer support 108. The electrostatic attraction firmly holds the wafer 104 in place on the top surface 122 on the wafer support 108. In an alternative embodiment, negative charges can accumulate at the top surface 122 of the wafer support 108 and positive charges can accumulate at the bottom surface 125 of the wafer 104.

Though not shown in FIG. 6A, the wafer support 108 can include a layer of conductive material at or near the top of the wafer support 108. One or more electrical connectors can be coupled to the layer of conductive material such that a voltage can be applied to the layer of conductive material in order to generate an electrostatic charge at the top surface 122 of the wafer support 108. The wafer support 108 may also include a thin layer of dielectric material on top of the layer of conductive material.

The electrostatic force holding the wafer 104 can also inhibit or prevent warping of the wafer 104 during semiconductor processes. In some cases, it is possible that edges of the wafer 104 may tend to warp upwards. However, the electrostatic force prevents the edges of the wafer 104 from warping or otherwise deforming.

Figure 6B:
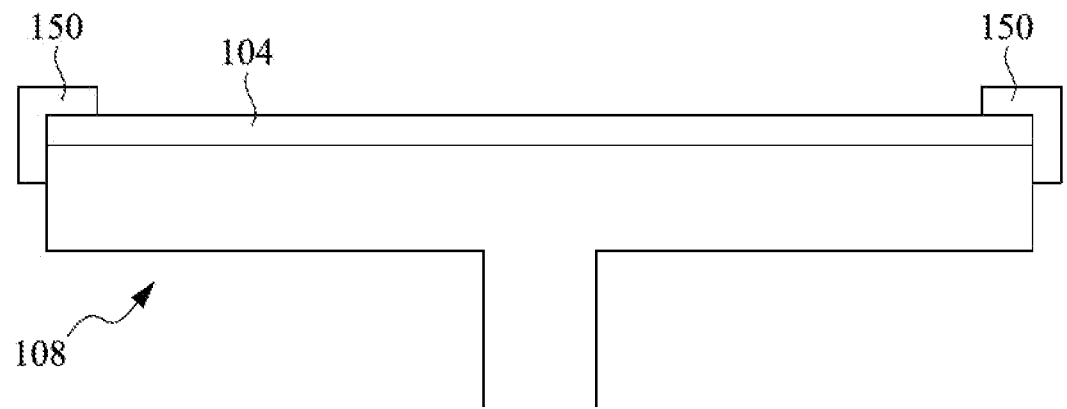
FIG. 6B is a cross-sectional view of a wafer support, according to one embodiment.

FIG. 6B illustrates a wafer support 108 supporting a wafer 104, according to one embodiment. The wafer support 108 includes clamps 150 that can be selectively operated to clamp the wafer 104 to the wafer support 108 during semiconductor processes. The clamps 150 can be selectively put in place to hold the wafer 104 and selectively removed to release the wafer 104. The clamping of the wafer 104 during semiconductor processes can help inhibit or prevent warping of the wafer 104 as described above. Though not shown in FIG. 6B, the wafer support 108 can include a plurality of selectively operable heating elements 112 as shown and described in relation to FIGS. 1-5B Embodiments of the present disclosure provide many benefits over traditional semiconductor process systems. Embodiments of the present disclosure provide a wafer support with an array of selectively operable heating elements. The heating elements can be operated to provide an even temperature distribution over a surface of a wafer supported by the wafer support. The heating elements can be operated to heat selected areas of the wafer more than others. The result of this is that semiconductor process can be performed more reliably and with better outcomes. Thin films can have uniform thickness. Pad sites can be selectively degassed in order to prevent damage to the wafer. Many other benefits can also result from selectively operable heating elements.

Figure 7:
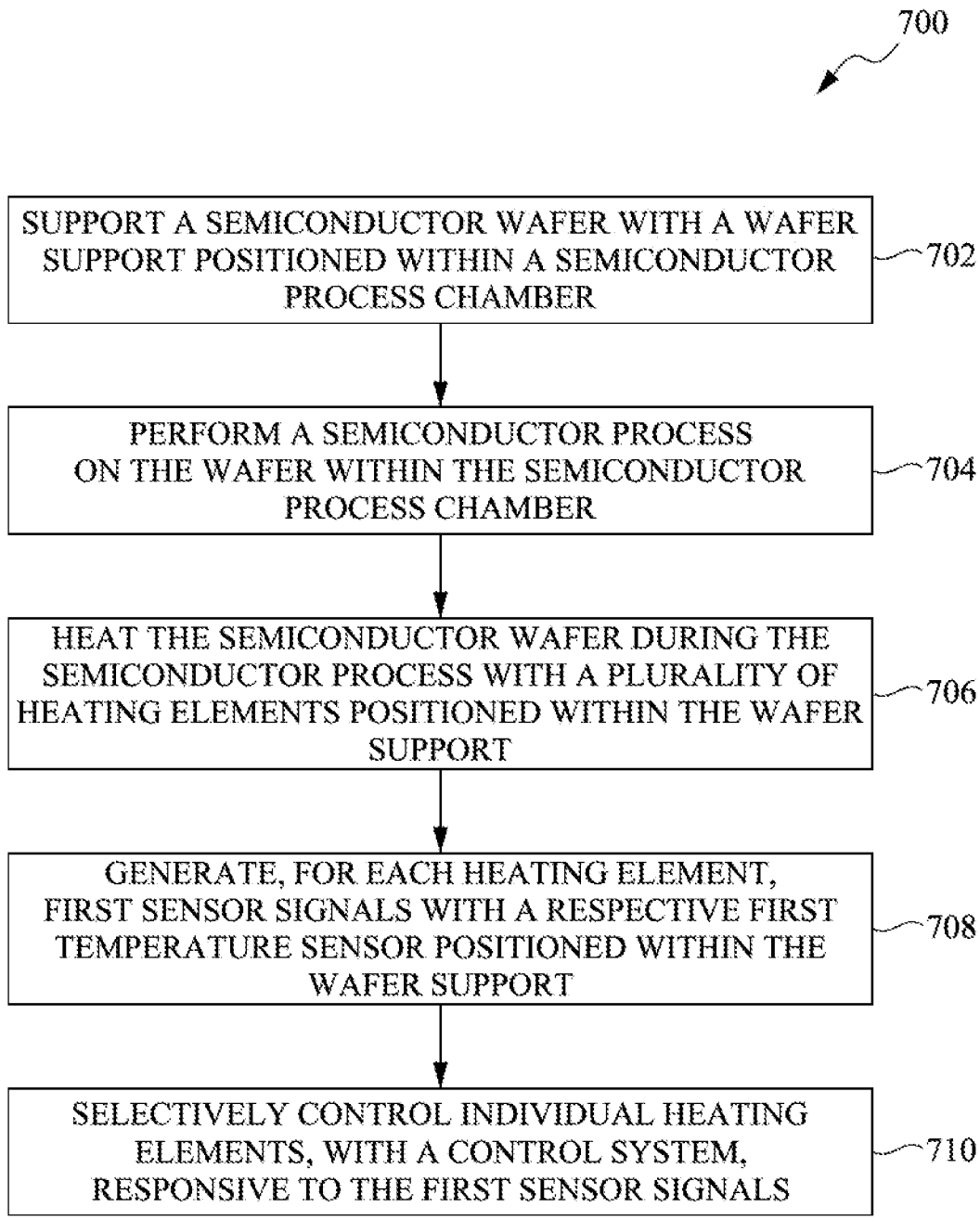
FIG. 7 is a flow diagram of a method 700 for performing a semiconductor process

FIG. 7 is a flow diagram of a method 700 for performing a semiconductor process. At 702, the method 700 includes supporting a semiconductor wafer with a wafer support positioned within a semiconductor process chamber. One example of semiconductor wafer is the semiconductor wafer 104 of FIG. 1. One example of a wafer support is the wafer support 108 of FIG. 1. One example of semiconductor process chamber is the semiconductor process chamber 102 of FIG. 1. At 704, the method 700 includes performing a semiconductor process on the semiconductor wafer within the semiconductor process chamber. At 706, the method includes heating the semiconductor wafer during the semiconductor process with a plurality of heating elements positioned within the wafer support. One example of heating elements are the heating elements 112 of FIG. 1. At 708, the method 700 includes generating, for each heating element, first sensor signals with a respective first temperature sensor positioned within the wafer support. One example of temperature sensors are the temperature sensors 114 of FIG. 1. At 710, the method 700 includes selectively controlling individual heating elements, with a control system, responsive to the first sensor signals. One example of a control system is the control system 110 of FIG. 1.

In one embodiment, a wafer support includes a top surface configured to support a semiconductor wafer and an array of heating elements positioned below the top surface and configured to output heat. The wafer support includes an array of temperature sensors including, for each heating element, a respective first temperature sensor configured to generate first sensor signals. The wafer support includes a plurality of first electrical connectors coupled to the heating elements and configured to enable selective control of individual heating elements. The wafer support includes a plurality of second electrical connectors coupled to the first temperature sensors.

In one embodiment, a semiconductor process system includes a semiconductor process chamber and a wafer support positioned in the semiconductor process chamber and configured to support a semiconductor wafer. The wafer support includes an array of heating elements each configured to heat the semiconductor wafer when the semiconductor wafer is positioned on the wafer support. The wafer support includes an array of temperature sensors including, for each heating element, a respective first temperature sensor configured to generate first sensor signals. The semiconductor process system includes a control system communicatively coupled to the heating elements and the first temperature sensors and configured to selectively operate individual heating elements responsive, at least in part, to the first sensor signals.

In one embodiment, a method includes supporting a semiconductor wafer with a wafer support positioned within a semiconductor process chamber, performing a semiconductor process on the semiconductor wafer within the semiconductor process chamber, and heating the semiconductor wafer during the semiconductor process with a plurality of heating elements positioned within the wafer support. The method includes generating, for each heating element, first sensor signals with a respective first temperature sensor positioned within the wafer support and selectively controlling individual heating elements, with a control system, responsive to the first sensor signals.

Embodiments of the present disclosure provide many benefits over traditional semiconductor process systems.

Embodiments of the present disclosure provide a wafer support with an array of selectively operable heating elements. The heating elements can be operated to provide an even temperature distribution over a surface of a wafer supported by the wafer support. The heating elements can be operated to heat selected areas of the wafer more than others. The result of this is that semiconductor process can be performed more reliably and with better outcomes. Thin films can have uniform thickness. Pad sites of the wafer can be selectively degassed in order to prevent damage to the wafer. Many other benefits can also result from selectively operable heating elements.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A wafer support, comprising:
   a top surface configured to support a semiconductor wafer;
   an array of heating elements positioned below the top surface and configured to output heat;
   an array of temperature sensors including, for each heating element, a respective first temperature sensor configured to generate first sensor signals;
   a plurality of first electrical connectors coupled to the heating elements and configured to enable selective control of individual heating elements; and
   a plurality of second electrical connectors coupled to the first temperature sensors, wherein the each heating element includes a respective heating coil, wherein the array of temperature sensors includes, for each heating element, a respective second temperature sensor configured to generate second sensor signals.

2. The wafer support of claim 1, wherein, for each heating element, the respective first temperature sensor is positioned below the respective second temperature sensor.

3. The wafer support of claim 2, wherein, for each heating element, the first sensor signals are indicative of a temperature of the heating coil.

4. The wafer support of claim 3, wherein, for each heating element, the second sensor signals are indicative of a temperature of a region of the semiconductor wafer above the heating element.

5. The wafer support of claim 4, wherein each heating element includes a ceramic material encasing the heating coil.

6. The wafer support of claim 5, wherein the ceramic material encases the first and second temperature sensors.

7. The wafer support of claim 1, further comprising a conductive material configured to hold the semiconductor wafer in place via electrostatic force.

8. The wafer support of claim 1, further comprising a clamp configured to hold the semiconductor wafer in place.

9. The wafer support of claim 1, wherein the first temperature sensors include thermocouples.

10. A semiconductor process system, comprising:
    a semiconductor process chamber;

a wafer support positioned in the semiconductor process chamber, the wafer support including:
  a top surface configured to support a semiconductor wafer;
  an array of heating elements below the top surface and each configured to heat the semiconductor wafer when the semiconductor wafer is positioned on the wafer support; and
  an array of temperature sensors including, for each heating element, a respective first temperature sensor configured to generate first sensor signals; and
a control system communicatively coupled to the heating elements and the first temperature sensors and configured to selectively operate individual heating elements responsive, at least in part, to the first sensor signals, wherein the array of temperature sensors includes, for each heating element, a respective second temperature sensor configured to generate second sensor signals.

11. The semiconductor process system of claim 10, wherein the control system is configured to operate the heating elements to generate an even temperature distribution on a surface of the semiconductor wafer.

12. The semiconductor process system of claim 10, wherein the control system is configured to operate the heating elements to selectively heat some regions of the semiconductor wafer more than other regions.

13. The semiconductor process system of claim 10, further comprising semiconductor process equipment communicatively coupled to the control system and configured perform a semiconductor process on the semiconductor wafer within the semiconductor process chamber, wherein the control system is configured to adjust the semiconductor process equipment responsive to the first sensor signals.

14. The semiconductor process of claim 10, wherein, for each heating element, the first sensor signals are indicative of a temperature of the heating element, wherein the second sensor signals are indicative of a temperature of a region of the semiconductor wafer above the heating element.

15. The wafer support of claim 10, wherein each heating element includes a ceramic material encasing the heating coil.

16. The wafer support of claim 15, wherein the ceramic material encases the first and second temperature sensors.

17. A system, comprising:
  a semiconductor process chamber;
  a wafer support positioned within a semiconductor process chamber and including a top surface configured to support a semiconductor wafer;
  a plurality of heating elements within the wafer support and below a top surface of the wafer support, the heating elements configured to heat the semiconductor wafer during a semiconductor process, each heating element including a first temperature sensor configured to generate first sensor signals; and
  a control system configured to selectively controlling individual heating elements responsive to the first sensor signals, wherein each heating element includes a second temperature sensor configured to generate second sensor signals, wherein the control system is configured to selectively control individual heating elements responsive to the second sensor signals.

18. The system of claim 17, wherein the control system is configured to adjust the semiconductor process responsive to the first sensor signals.

19. The wafer support of claim 17, further comprising a conductive material configured to hold the semiconductor wafer in place via electrostatic force.

20. The wafer support of claim 17, wherein the first temperature sensors include thermocouples.

* * * * *